(12) United States Patent
Onodera et al.

(10) Patent No.: US 6,274,242 B1
(45) Date of Patent: Aug. 14, 2001

(54) LIQUID CRYSTAL POLYMER FILM, LAMINATE, METHOD OF MAKING THEM AND MULTI-LAYERED PARTS-MOUNTED CIRCUIT BOARD

(75) Inventors: Minoru Onodera; Yoshinobu Tanaka, both of Kurashiki (JP)

(73) Assignee: Kuraray Co., Ltd., Kurashiki (JP)

( * ) Notice: Subject to any disclaimer, the term of this patent is extended or adjusted under 35 U.S.C. 154(b) by 0 days.

(21) Appl. No.: 09/283,871

(22) Filed: Apr. 1, 1999

(30) Foreign Application Priority Data

| Apr. 6, 1998 | (JP) | ................................. 10-093299 |
| Feb. 25, 1999 | (JP) | ................................. 11-048141 |

(51) Int. Cl.$^7$ ............................. H05K 3/46; B32B 9/04; C09K 19/38
(52) U.S. Cl. ............................. 428/411.1; 252/299.01; 428/480; 264/345; 438/763
(58) Field of Search ..................... 252/299.01; 428/411.1, 428/480; 264/345; 438/763

(56) References Cited

U.S. PATENT DOCUMENTS

| 4,802,061 | 1/1989 | Portugall et al. . |
| 4,837,268 | 6/1989 | Matsumoto et al. . |
| 4,851,503 | 7/1989 | Matsumoto et al. . |
| 4,983,318 | 1/1991 | Matsumoto et al. . |
| 5,091,138 | 2/1992 | Ishii et al. . |
| 5,326,848 | 7/1994 | Kashimura et al. . |
| 5,347,154 | * 9/1994 | Takahashi et al. .................... 257/347 |
| 5,360,672 | 11/1994 | Saito et al. . |
| 5,460,748 | * 10/1995 | Mazaki et al. .................... 252/299.01 |
| 5,529,740 | 6/1996 | Jester et al. . |
| 5,601,884 | * 2/1997 | Ohnishi et al. .......................... 428/1 |
| 5,688,436 | * 11/1997 | Ohnishi et al. .................. 252/299.01 |
| 5,693,253 | * 12/1997 | Ohnishi et al. .................. 252/299.01 |
| 5,703,202 | 12/1997 | Jester et al. . |
| 5,719,354 | 2/1998 | Jester et al. . |
| 5,730,899 | * 3/1998 | Ohnishi et al. .................. 252/299.01 |
| 5,736,066 | * 4/1998 | Noguchi et al. ................ 252/299.01 |
| 5,843,562 | 12/1998 | Onodera et al. . |
| 6,027,771 | * 2/2000 | Moriya et al. .......................... 428/1 |

FOREIGN PATENT DOCUMENTS

| 3625263 | 2/1988 | (DE) . |

* cited by examiner

Primary Examiner—Shean C. Wu
(74) Attorney, Agent, or Firm—Oblon, Spivak, McClelland, Maier & Neustadt, P.C.

(57) ABSTRACT

A polymer film capable of forming an optically anisotropic melt phase is, after having been laminated on a base material capable of supporting the shape of the film during heat treatment, is heat-treated at a temperature of from the thermal deformation temperature Tdef of the film to a temperature lower by $\alpha$ ($\alpha$=10 to 35° C.) than the melting point Tm of the film until the fusion peak temperature TA of the film attains a temperature which is higher by $\beta$ ($\beta$=5 to 30° C.) than the melting point Tm of the film before the heat treatment and is subsequently heat-treated at a temperature of from a temperature not lower than the melting point Tm of the film to a temperature lower than the fusion peak temperature TA for a length of time over which the TA increases by $\gamma$ ($\gamma$=5 to 20° C.), and thereafter the base material is removed to produce the film.

7 Claims, 2 Drawing Sheets

FIG. 2

LIQUID CRYSTAL POLYMER FILM, LAMINATE, METHOD OF MAKING THEM AND MULTI-LAYERED PARTS-MOUNTED CIRCUIT BOARD

BACKGROUND OF THE INVENTION 1. (Field of the Invention)

The present invention relates to a film comprising a polymer capable of forming an optically anisotropic melt phase, a laminate comprising a base material applied with the polymer film, a method of making them and a multi-layered parts-mounted circuit board utilizing the laminate.

In the description that follows, the polymer capable of forming an optically anisotropic melt phase is referred to as the "liquid crystal polymer".

2. (Description of the Prior Art)

Recently in the field of electric and electronic industry, demands for flexible printed circuit boards (hereinafter referred to as "FPC boards") are increasing to cope with the need to make electric and electronic appliances compact and lightweight. The standard method of making the FPC boards comprises preparing a laminate made up of a base film having at least one of its opposite surfaces applied with a metal foil such as, for example, a copper foil and forming a pattern of electric circuits on the laminate. In most cases, a film of polyethylene terephthalate is generally used for the base film. However, since the polyethylene terephthalate film has an insufficient heat resistance, it has been found problematic in that when electric and/or electronic component parts are mounted on the FPC board and when the FPC board with the electric and/or electronic component parts thereon is subsequently dipped in a solder bath, the base film in the FPC board is susceptible to bulging, peel-off and/or thermal deformation. In view of this, the film made of the liquid crystal polymer excellent in heat resistance has now gained attentions as a material for the base film.

However, since the liquid crystal polymer generally has a high heat resistance, and when the liquid crystal polymer is desired to be molded into a film, not only is a relatively high molding temperature required accompanied by consumption of a relatively large amount of energies, but also the liquid crystal polymer itself tends to be thermally decomposed. Although of the various liquid crystal polymers the liquid crystal polymer capable of being molded at a relatively low molding temperature is available, it has often been found that the resultant film made of that liquid crystal polymer tends to have a low heat resistance and can, therefore, not be suited as a material for the heat resistant base film. Accordingly, a method has been suggested in, for example, the Japanese Laid-open Patent Publication No. 3-152132 wherein, after a film has been prepared from the liquid crystal polymer having a low molding temperature, the resultant liquid crystal polymer film is heat-treated at a temperature not higher than the melting point Tm of the liquid crystal polymer, but not lower than 200° C. under the atmosphere of vacuum or reduced pressure to thereby impart a heat resistance to the liquid crystal polymer film.

The prior art method such as discussed above requires the heat treatment to be carried out for a substantial length of time under the vacuum or reduced pressure. Also, no means is employed to allow the liquid crystal polymer film to retain its shape and the film tends to loose its shape when heated to a temperature approaching the melting point of the liquid crystal polymer and, therefore, the film having an excellent appearance is hardly obtainable. More specifically, if the film itself is heat-treated at a temperature not lower than the thermal deformation temperature at which thermal deformation is initiated, the film is susceptible to deformation and stress build-up and thermal deformation is pronounced particularly where the film has a small thickness. To avoid this thermal deformation, the film is required to be heat-treated at a temperature region not higher than the thermal deformation temperature at which the thermal deformation starts. This heat-treatment requires an increased length of time until the film gains a required heat resistance, accompanied by reduction in productivity. On the other hand, if the heat-treatment is carried out with the h eating temperature increased to a value in the vicinity of the melting point Tm of the film, the productivity may be improved. However, the method has not yet been made available that is effective to accomplish the intended heat treatment optimally without allowing the film to be thermally deformed and to retain its shape throughout the heat-treatment process. In addition, in order for the film to be available as a commercial and/or industrial product, the film must be of a kind capable of being manufactured consistently and continuously, however, the method accomplishing this has not yet been known in the art.

According to the Japanese Patent Publication No. 55-20008, the heat-treatment of liquid crystal polymer filaments has been suggested in which the liquid crystal polymer filaments are heat-treated at a temperature lower by about is 20° C. than the flow initiation temperature thereof to increase the strength by 50%.

The Japanese Laid-open Patent Publication No. 2-133347 discloses a method wherein the liquid crystal polymer filaments are heat-treated to a temperature ranging from the melting point of aromatic polyester, the material for the liquid crystal polymer filaments, to a temperature lower by 50° C. than such melting point to thereby provide filaments of a high strength having a high Young's modulus of elasticity. However, the heat treatment of the liquid crystal polymer filaments disclosed therein is quite different from the heat treatment, such as carried out in the practice of the present invention as will be described later, in which the film to be heat-treated is kept flat, which heat treatment may be termed "planar heat treatment".

The Japanese Laid-open Patent Publication No. 8-90570 discloses a method of heat-treating a liquid crystal polymer film, which comprises subjecting a liquid crystal polymer film in contact with a film support (a base material) to a fusion heat-treatment, cooling the both to form a layered structure comprising the solidified liquid crystal polymer layer and the film support, again subjecting the layered structure to a heat treatment to allow the solidified liquid crystal polymer layer to be heated at a temperature ranging from about 150° C. to a temperature lower by 30° C. than the thermal deformation temperature at which the liquid crystal polymer layer may start its thermal deformation, and then separating the liquid crystal polymer layer from the film support. However, according to this known method, the heat-treatment in which the liquid crystal polymer film is melted is carried out at a temperature not lower than the melting point of the liquid crystal polymer film (In this respect, the heat treatment employed in the practice of the present invention is different from this method.) and the heat-treatment subsequent to the solidification is carried out at a temperature lower by 30° C. than the thermal deformation temperature (Contrary to this, the heat treatment employed in the present invention is carried out at a temperature higher than this thermal deformation temperature). Accordingly, this known method is incapable of providing the liquid crystal polymer film having a high heat resistance and a high strength.

SUMMARY OF THE INVENTION

The inventors of the present invention have conducted a series of studies on the liquid crystal polymer film having a variety of excellent characteristics and laminates comprising the liquid crystal polymer film bonded to the base material and have found that if the liquid crystal polymer film was heat-treated at a temperature not lower than the thermal deformation temperature Tdef thereof, but lower than the melting point Tm thereof, the length of time required to accomplish the heat treatment could be reduced accompanied by increase of the heat resistance at a reduced cost.

Further studies conducted by the inventors of the present invention have revealed that a laminated structure in which the liquid crystal polymer film is deposited on the base material capable of retaining the shape of the liquid crystal polymer film is heat-treated under specific conditions, neither thermal deformation nor stress build-up would occur in the liquid crystal polymer film. In other words, if the laminated structure comprising the liquid crystal polymer film and the base material is heat-treated under the specific conditions, the heat treatment can be carried out within a temperature range of from the temperature not lower than the thermal deformation temperature Tdef to a temperature lower than the melting point Tm of the polymer film by $\alpha°$ C. (wherein $\alpha$ represents 10 to 35) without permitting a thermal deformation and the temperature at which the heat treatment is carried out can be progressively increased with increase of the melting point of the polymer film. For this reason, the length of time required to accomplish the heat treatment, that is, the heat treatment time can advantageously be reduced. It has been found that after the heat treatment, removal of the base material has resulted in the liquid crystal polymer film.

Accordingly, the present invention is intended to provide an improved liquid crystal polymer film having an increased heat resistance and an increased frictional resistance along with peculiarities of the liquid crystal polymer such as a high strength, a high modulus of elasticity and a high resistance to chemicals, an improved laminate comprising a base material and the liquid crystal polymer film of the kind referred to above, or an improved multi-layered parts-mounted circuit boards comprising the laminate of the type referred to above at a reduced cost.

In order to accomplish this object of the present invention, the liquid crystal polymer film is laminated with the base material capable of supporting the shape of the polymer film during the heat treatment and is subjected to the following heat treatment that is performed a number of times.

First Heat Treatment

This first heat treatment is carried out at a temperature range of from the thermal deformation temperature Tdef of the polymer film to a temperature lower by $\alpha°$ C. than the melting point Tm of the polymer film before the heat treatment (i.e., Tdef~(Tm–$\alpha°$ C.)), until the fuision peak temperature TA of the polymer film being heat-treated, which temperature TA is measured by the use of a differential scanning calorimeter under the atmosphere of nitrogen with temperature increased at a speed of 5° C. per minute, attains a temperature $TA_1$ which is higher by $\beta°$ C. than the melting point Tm of the polymer film before the heat treatment, wherein $\alpha$ represents 10 to 35° C. and $\beta$ represents 5 to 30° C.

Second Heat Treatment

This second heat treatment is carried out at a temperature range of from a temperature not lower than the melting point Tm of the polymer film before the heat-treatment to a temperature lower than the fusion peak temperature $TA_1$ until the fusion peak temperature $TA_1$ attains a temperature $TA_2$ that is increased $\gamma°$ C. from the fuision peak temperature $TA_1$, wherein $\gamma$ represents 5 to 20° C.

n-th Heat Treatment

This n-th heat treatment is carried out at a temperature range of from the fusion peak temperature $TA_{n-2}$ to a temperature lower than the fusion peak temperature $TA_{n-1}$ until the fusion peak temperature $T_{n-1}$ attains a temperature $TA_n$ that is increased $\gamma°$ C. from the fusion peak temperature $TA_{n-1}$, wherein n represents an integer equal to or larger than 3 and $\gamma$ represents 5 to 20° C.

After the heat treatment, the base material is removed to leave the liquid crystal polymer film.

Examples of material for the liquid crystal polymer film used in the present invention includes, for example, well known thermotropic liquid crystal polyester and thermotropic liquid crystal polyester amide prepared from compounds, such as classified under (1) to (4) below, and their derivatives. It is, however, pointed out that to prepare a liquid crystal polymer, various raw material compounds have their proper combination and amount carefully chosen.

(1) Aromatic or aliphatic dihydroxy compounds, representative examples of which are shown in Table 1 below.

TABLE 1

Chemical formulas of the representative examples
of aromatic or aliphatic dihydroxy compounds (X: hydrogen atom or halogen atom, or lower alkyl, phenyl or like groups)

TABLE 1-continued

Chemical formulas of the representative examples
of aromatic or aliphatic dihydroxy compounds HO—〈benzene〉—Y—〈benzene〉—OH  (Y: —O—, —CH$_2$—, —S— or like groups)

[anthraquinone with two OH groups]

[resorcinol: HO—〈benzene〉—OH]

HO(CH$_2$)$_n$OH (n: an integer from 2 to 12)

(2) Aromatic or aliphatic dicarboxylic acids, representative examples of which are shown in Table 2 below.

TABLE 2

Chemical formulas of the representative examples
of aromatic or aliphatic dicarboxylic acids HOOC—〈benzene〉—COOH,

[naphthalene-2,6-dicarboxylic acid]

HOOC—〈benzene〉—〈benzene〉—COOH,

HOOC—〈benzene〉—O—〈benzene〉—COOH,

HOOC—〈benzene〉—OCH$_2$CH$_2$O—〈benzene〉—COOH,

HOOC—〈benzene〉(COOH),

HOOC(CH$_2$)nCOOH (n: an integer from 2 to 12)

(3) Aromatic hydroxycarboxylic acid, representative examples of which are shown in Table 3 below.

TABLE 3

Chemical formulas of the representative examples
of aromatic hydroxycarboxylic acids HO—〈benzene〉—COOH with X  (X: hydrogen atom or halogen atom, or lower alkyl, phenyl or like groups)

[6-hydroxy-2-naphthoic acid]

HO—〈benzene〉—〈benzene〉—COOH,

HO—〈benzene〉—COOH (4) Aromatic diamines, aromatic hydroxyamines and aromatic aminocarboxylic acids, representative examples of which are shown in Table 4 below.

TABLE 4

Chemical formulas of representative examples of aromatic
diamines aromatic hydroxyamines and aromatic aminocarboxylic acids H$_2$N—〈benzene〉—NH$_2$, H$_2$N—〈benzene〉—OH,

TABLE 4-continued

Chemical formulas of representative examples of aromatic
diamines aromatic hydroxyamines and aromatic aminocarboxylic acids

(5) Representative examples of the liquid crystal polymers prepared from any of those starting material compounds include copolymers having such structural units as indicated by (a) to (e) in Table 5 below.

additives such as a smoothing agent, an antioxidant and a filler may be added thereto if desired.

The film prepared from any of those liquid crystal polymers discussed above can be made by the use of one or a combination of the well-known T-die process and the well-known inflation process. Particularly with the inflation method, stresses can be applied not only in a direction of the mechanical axis of the film (which direction is hereinafter referred to as the MD direction), but also in a direction (hereinafter referred to as TD direction) perpendicular to the MD direction and, therefore, the inflation method is effective, and is therefore advantageously employed, to eventually manufacture the liquid crystal polymer film having balanced physical and thermal properties in both of the MD and TD directions.

TABLE 5

Structural units of the representative
examples of liquid crystal polymers (X: —O—, —CH$_2$—, —S— or like groups)

Those liquid crystal polymers preferably have a transition temperature to an optically anisotropic melt phase within the range of from about 200 to about 400° C., more preferably from about 250 to about 350° C., so that the resultant film can have a desirable heat resistance and a desirable processability. Unless physical properties of the liquid crystal polymer film are impaired, one or a mixture of various The liquid crystal polymer film employed in the practice of the present invention is preferably, although not exclusively limited thereto, of a thickness not greater than 5 mm and more preferably within the range of 0.1 to 3 mm as far as it is used as a material for a printed circuit board. Where it is used as a material for FPC board, the thickness of the liquid crystal polymer film is preferably not greater than 500 μm and more preferably within the range of 10 to 250 μm.

As a material for the base material to be laminated with the liquid crystal polymer film of the kind discussed above, the material having a melting point higher than that of such liquid crystal polymer film, such as a metal including, for example, copper, nickel, aluminum, silver or gold, or an inorganic material such as glass, and capable of supporting the shape of such liquid crystal polymer film during the heat treatment can be suitably employed. Since as the base material, particularly the metal, has a high thermal conductivity, it can be effectively employed to facilitate increase of the temperature of the liquid crystal polymer film to a desired temperature during the heat treatment and, hence, to reduce the time required to complete the heat treatment. The base material employed in the practice of the present invention may be in any suitable form, for example, in the form of a film, a sheet or a plate, provided that it has a surface with or without fine surface irregularities, which is generally flat so as to support the liquid crystal polymer film so that during the heat treatment any undesirable flow of the liquid crystal polymer film can be prevented. The base material may advantageously be employed in the form of a metal foil or, in particular, a copper foil. The base material may have any suitable thickness which may be selected depending on a particular application and preferably has a thickness within the range of 10 to 1,000 μm where the laminate of the present invention is, for example, used in FPC boards. On the other hand, where the film deposited base material is used as an insulating material in a heat radiating plate for efficiently dissipating heat evolved by a loss of electric power during operation of a semiconductor device, the heat radiating plate preferably has a thickness within the range of 0.1 to 5 mm. Also, where the liquid crystal polymer film is desired to be produced by peel-off from the base material, the thickness of the base material within the range of 0.03 to 0.1 mm is preferred.

Bonding of the liquid crystal polymer film to the base material may be suitably carried out by means of a heat bonding technique such as, for example, by the use of any known hot press or a hot roller press. The press temperature, that is, the temperature at which the heat bonding is carried out may vary depending on the type of the liquid crystal polymer film used, but is preferably within the range of the temperature, which is lower by 80° C. than the transition temperature to a liquid crystal phase under the elevating temperature, to the temperature higher by 20° C. than the transition temperature to such liquid crystal phase.

The laminate comprising the liquid crystal polymer film of the kind described above and the base material of the kind also described above are subjected to the heat treatment a number of times under the specific condition described hereinbefore.

If the heat-treating condition departs from the specific heat-treating condition specified hereinbefore, the base material will undergo discoloration and will be unable to exhibit a desired heat resistance and a desired flexibility. Considerable departure from the specific heat-treating condition would result in, for example, an undesirable deformation of the liquid crystal polymer film separated or delaminated from the laminate. In particular, during the initial heat treatment during which the polymer film is bonded to the base material, that is, the first heat treatment, the polymer film is prone to thermal deformation and, therefore, it is essential for the heat treatment to be carried out at the temperature range of from the thermal deformation temperature Tdef of the polymer film to the temperature lower by α (α=10 to 35° C.) than the melting point Tm of the polymer film. If the parameter α is smaller than 10° C., the heat-treating temperature will approaches the melting point Tm before the heat treatment and, therefore, there is the possibility that the polymer film will melt locally. On the other hand, if the parameter a is larger than 35° C., the heat-treating temperature would be undesirably so low as to increase the heat-treating time and is therefore unpractical.

During the second heat treatment, the polymer film is rather less prone to thermal deformation than that during the first heat treatment and it is therefore desirable for the heat treatment to be carried out at the temperature range of from the temperature not lower than the melting point Tm of the polymer film to the temperature lower than the fusion peak temperature $TA_1$ that has increased as a result of the first heat treatment, to thereby facilitate increase of the melting point of the polymer film that is brought about by the heat treatment. However, where the heat-treating temperature employed during the second heat treatment is higher than the fusion peak temperature $TA_1$ that has increased as a result of the first heat treatment, the heat resistance of the liquid crystal polymer will return to the melting point Tm of such polymer before the heat treatment with the effect of the first heat treatment consequently lost. Accordingly, the heat-treating temperature higher than the fusion peak temperature $TA_1$ should be avoided. A similar description made in connection with the second heat treatment is equally applicable to the n-th heat treatment that follows.

Figure 1:
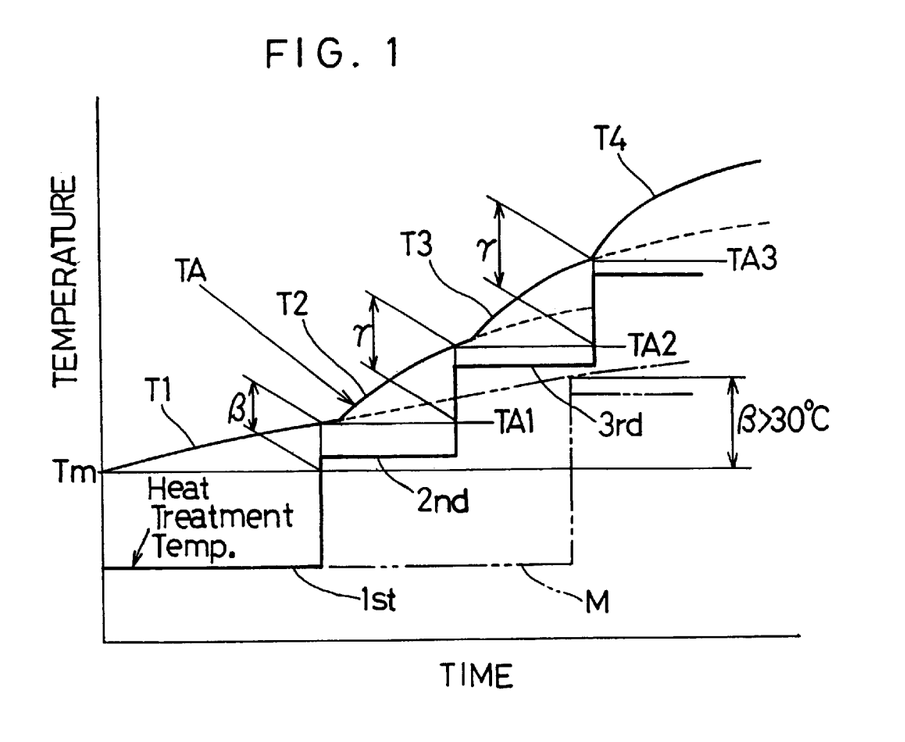
FIG. 1 is a characteristic graph showing the relationship between the fusion peak temperature of the liquid crystal polymer film and the heat-treating temperature employed in the practice of the present invention.

The relationship between the heat-treating temperature employed in the practice of the present invention and the fusion peak temperature TA is shown in FIG. 1. As can be seen from FIG. 1, the heat-treating temperature is lower than the fusion peak temperature TA at all times. This fusion peak temperature TA increases as shown by a curve T1 as a result of the first heat treatment and further increases as shown by respective curves T2, T3 and T4 as a result of the subsequent second, third and fourth heat treatments. If the temperature increment β of the fusion peak temperature TA brought about by the first heat treatment is lower than 5° C., the temperature control of a heat-treating furnace will be difficult to achieve. On the other hand, if the temperature increment β exceeds 30° C., start of the second heat treatment will be retarded as shown by phantom line M accompanied by a corresponding delay in increase of the fusion peak temperature TA, the consequence of which will be an increase of the heat-treating time to attain a given heat-resistant temperature to which the polymer film can thermally withstand. The foregoing description concerning the temperature increment of the fusion peak temperature during the second heat treatment is equally applicable to the temperature increment γ during the heat treatment that is carried out subsequent to the second heat treatment, except that the temperature increment γ is chosen to be within the range of 5 to 20° C. by the same reason as described above.

Although the above described heat treatment may be carried out under the active atmosphere such as the air atmosphere, it is preferably carried out under the inactive atmosphere to avoid discoloration of the metal foil. The inactive atmosphere referred to above is intended to mean the atmosphere full of an inert gas such as nitrogen or argon or the pressure-reduced atmosphere, whichever contains an active gas such as oxygen in a quantity not higher than 0.1 vol. %. In particular, for the inactive gas, a heated nitrogen gas having a purity of 99.9% or higher is suitably employed in the practice of the heat treatment according to the present invention.

After the laminate has been heat-treated under the specific condition described above, the polymer film is separated away from the base material and, hence, delaminated. By so doing, the polymer film can be obtained, having an increased heat resistance and an increased frictional resistance along with peculiarities of the liquid crystal polymer film such as a high strength, a high modulus of elasticity and a high resistance to chemicals. Specifically, the heat resistance of the resultant polymer film can be increased to 350° C. or higher. Accordingly even when electric and/or electronic component parts are mounted on the FPC board and the FPC board with the electric and/or electronic component parts thereon is subsequently dipped in a solder bath, the problem associated with bulging, peel-off and/or thermal deformation will not occur. In other words, by utilizing the polymer film which can thermally withstand the temperature of 350° C. or higher and, also, the base material in the form of the metal foil which can also thermally withstand the temperature of 350° C. or higher, a favorable surface-mounting of the electric and/or electronic component parts can be accomplished without incurring the problem associated with the thermal deformation.

Also, without the polymer film delaminated, the polymer film bonded to the base material is utilized as a laminate in the present invention. At this time, depending on the type of the base material, the laminate in which the polymer film is bonded to the base material with a sufficiently high bonding strength and which has an excellent dimensional stability can be obtained and can suitably be used as a material for the multi-layered parts-mounted circuit boards.

The fusion peak temperature TA and the melting point Tm, both referred to in association with the liquid crystal polymer film of the present invention were measured by observing the thermal behavior of the polymer film with the use of the differential scanning calorimeter. In other words, the melting point Tm before the heat treatment is defined as represented by the position of an endothermic peak that appears when the polymer film is heated at a temperature increasing at the rate of 5° C. per minute and the fusion peak temperature TA is defined as represented by respective positions during and after the heat treatment.

The thermal deformation temperature Tdef is measured as a result of the following measurement. More specifically, using a thermal mechanical analyzer commercially available from Rigaku International Co., a corporation of Japan, a curve was obtained which is descriptive of change in dimension (expressed in terms of %) with change in temperature (expressed in terms of ° C.) when the polymer film was heated at the rate of 5° C. per minute while 1 gr. of load was applied to the polymer film, 5 mm in width and 20 mm in length. The thermal deformation temperature is determined by determining the temperature at which the rate of change in dimension abruptly increases during increase of the heating temperature.

In carrying out the heat treatment of the laminate, it may be carried out while the laminate is held under tension or not under tension depending on the purpose for which it is used. The heat treatment may be performed on a batch process in the form of a rolled configuration with respective turns spaced radially to avoid contact between the neighboring turns, in the form of a shackled roll with respective turns spaced radially by the intervention of a highly gas-permeable spacer such as, for example, a spacer prepared from a "Vectran"® non-woven fabric, or in the form of a towed configuration while placed on, for example, a metal mesh or the like, or on a continuous process in which a plurality of rollers are used to transport the laminate being heat-treated in the form of the rolled configuration, the shackled roll or the towed configuration. Where the laminate is heat-treated on the batch process, the stepwise heat treatment, i.e., the heat treatment with the temperature increased stepwise, in accordance with the present invention can be accomplished by stepwise increasing the temperature of the heat-treating furnace. On the other hand, where the heat treatment is performed on the continuous process, the stepwise heat treatment in accordance with the present invention can be accomplished by providing the heat-treating furnace with a plurality of heat treatment zones, controlling those heat treatment zones to respective stepwise increasing temperatures and transporting the laminate successively through those temperature-controlled heat treatment zones starting from the heat treatment zone of the lowest temperature.

Although as hereinabove discussed, the intended polymer film can be obtained by delaminating the laminate which has been heat-treated, a release coat process is preferably applied to the base material used so that the delamination can be achieved in a favorably stabilized fashion. This process can be performed by applying a silicone polymer to the base material and drying it to form a coating on the base material. At this time, the coating on the base material is preferably of a kind capable of exhibiting a bonding strength of 0.05 Kg/cm or higher before the heat treatment and that of 0.4 Kg/cm or lower and more preferably, 0.2 Kg/cm or lower after the heat treatment. The higher the bonding strength before the heat treatment, the higher the morphological stability of the polymer film, and where it is low, an adverse influence will be brought about such as delamination and/or thermal tear. On the other hand, the lower the bonding strength after the heat treatment, the higher the delamination stability, and where the bonding strength is high, the possibility will arise that the polymer film may break during the delimitation in the presence of even a slight scratch.

In view of the foregoing, in a preferred embodiment of the present invention, the base material is employed in the form of a metal foil (made of, for example, steel, copper, aluminum, nickel, silver or gold) having a surface with surface irregularities of the maximum surface roughness (Rmax: as measured according to the method stipulated in B0601 of Japanese Industrial Standards) within the range of 1.0 to 10 $\mu$m and coated with a silicone polymer as a release agent to a thickness of 0.1 to 1 $\mu$m. If the maximum surface roughness is smaller than 1.0 $\mu$m, the polymer film may flow during the heat treatment. On the other hand, if the maximum surface roughness is greater than 10 $\mu$m, the polymer film, particularly the thin film, may be prone to tear in a direction across the thickness thereof and may therefore be easily break during the delamination of the polymer film from the base material. Accordingly, the maximum surface roughness of the surface irregularities should be within the range specified above. Then, the base material is laminated together with the polymer film with at least one surface of the polymer film held in contact with the base material, for example, by the application of a pressure. After the resultant laminate has been heat-treated a number of times, the melt and softened film is cooled and the solidified film layer is separated or delaminated from the base material.

The surface irregularities present on the surface of the base material may be in the form of projections, crater-like recesses, line scratches or any other shape provided that the silicone polymer can effectively deposit on the s surface of the base material. In addition, the surface of the metal foil may have a curved shape corresponding to the curvature of a roll, but a substantially flat surface such as appearing in a film, sheet or plate is preferred because it can advantageously prevent the liquid crystal polymer from flowing when melted and because the polymer film can easily be delaminated from the support base.

The silicone polymer referred to above may be of a kind having a fundamental chemical structure thereof which is expressed by $\{-(CH_3)_2Si-O-\}$, and this type of polymer can exhibit a considerably strong binding power with a metal and exhibit such a property that the affinity with resin is considerably low. If the thickness of the silicone polymer is smaller than 0.1 µm, delamination of the polymer film from the base material will be difficult to achieve, but if it is greater than 1 µm, the possibility will arise that although delamination between the polymer film and the base material can be easily achieved, not only may a substantial amount of the silicone polymer be wasted, but also the silicone polymer will stick to the liquid crystal polymer film to such an extent as to result in delamination from the base material, resulting in incapability of the base material being reused. Accordingly, the layer thickness of the silicone polymer referred to above should be within the range specified above.

As discussed above, by forming surface irregularities on a surface of the metal foil which has a maximum surface roughness within the range of 1.0 to 10 µm and then coating the silicone polymer on the roughened surface of the metal foil to a thickness within the range of 0.1 to 1 µm, the bonding strength between the film and the support base before the heat treatment can be of a value not smaller than 0.05 Kg/cm and that after the heat treatment can be of a value not greater than 0.4 Kg/cm. Thus, the film can retain a morphologically stabilized shape during the heat treatment without being affected by adverse influences such as, for example, delamination and/or breakage. Also, after the heat treatment, the laminate can be manually delaminae easily and in a stabilized fashion without the film breakage incurred.

BRIEF DESCRIPTION OF THE DRAWINGS

In any event, the present invention will become more clearly understood from the following description of a preferred embodiment thereof, when taken in conjunction with the accompanying drawings. However, the embodiment and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DETAILED DESCRIPTION OF THE EMBODIMENT

Hereinafter, the present invention will be described in connection with a preferred embodiment thereof with reference to the accompanying drawings.

Figure 2:
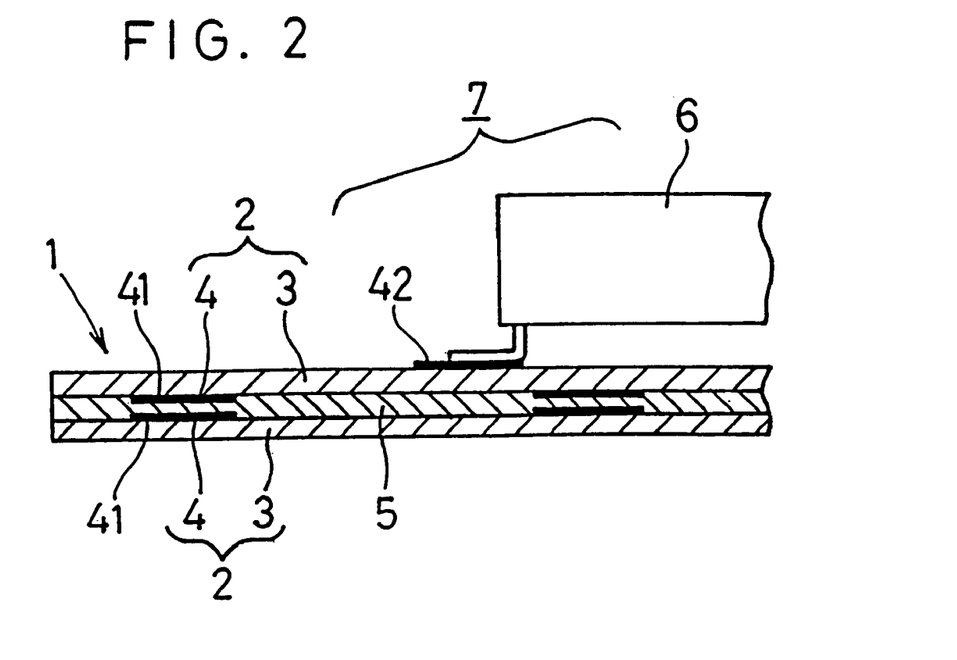
FIG. 2 is a schematic sectional view of a multi-layered parts-mounted circuit board employing the laminate according to the present invention.

FIG. 2 illustrates a multi-layered surface-mounting circuit substrate 1 which comprises first and second laminates generally identified by 2. Each of the first and second laminates 2 is prepared by bonding a copper foil 4, which is a base material or carrier base, to at least one of opposite surfaces of a liquid crystal polymer film 3 which serves as an electric insulating layer. Each of the first and second laminates 2, 2 has the corresponding copper foil 4 etched off to form an electroconductive pattern 41. The first and second laminates 2, 2 are bonded together with the respective electroconductive patterns 41, 41 confronting with each other. However, to avoid a direct contact between the electroconductive patterns 41, 41 on the first and second laminates 2, 2, a sheet-like material 5 made of a liquid crystal polymer film is sandwiched between the first and second laminates 2, 2. It is to be noted that the sheet-like material 5 may contain a reinforcement such as a woven fabric of glass fibers. Electronic component parts 6 such as IC chips, capacitors and resistors are mounted on wiring conductors 42 formed on a surface of the film 3 of the laminate 2, to thereby complete the multi-layered parts-mounted circuit board 7. It is also to be noted that where the electroconductive patterns 41, 41 on the first and second laminates 2, 2 do not confront with each other, the use of the sheet-like material 5 may not be essential and may therefore be dispensed with.

Hereinafter, the present invention will be demonstrated by way of examples which are shown only for the purpose of illustration and are not intended to limit the scope of the present invention.

Example 1

(1) In the first place, a thermotropic liquid crystal polyester containing 27 mol % of units from 6-hydroxy-2-naphthoic acid and 73 mol % of units from p-hydroxybenzoic acid was heat-kneaded through a single-screw extruder at a temperature of 280 to 300° C. and was then extruded through an inflation die, 40 mm in diameter and 0.6 mm in slit size, to produce a liquid crystal polymer film having a thickness of 50 µm The resultant liquid crystal polymer film had a melting point Tm of 280° C. and a thermal deformation temperature Tdef of 230° C.

(2) Also, using a copper foil (½ ounce copper foil based on the electrolytic method) of 18 µm in thickness as the base material, this copper foil was thermally pressed to the above described film at 260° C. to produce a laminate.

(3) In order to measure change of the melting point resulting from the heat treatment of this laminate, the fusion peak temperature TA of the film layer was measured at intervals of one hour with the use of DSC (differential scanning calorimeter) by heat-treating the laminate at 260° C. under the nitrogen atmosphere. As a result thereof, the temperature TA increased 278° C. when untreated, increased 285° C. after one hour, increased 296° C. after two hours and increased 306° C. after four hours. The thermal deformation temperature of the film which had been heat-treated for four hours was 275° C. Thus, as the heat treatment time of the film is prolonged, the TA thereof progressively increases. It is accordingly understood that the thermal deformation temperature Tdef can correspondingly increase.

(4) In the second place, the laminate obtained as in (2) above was horizontally fixed in the nitrogen atmosphere within a hot air dryer producing a hot gas of 260° C. in such a positional relationship that the film surface was oriented upwards while the copper foil surface was oriented downwards, to cause the film surface temperature to be increased to 260° C., and the heated laminate was heat-treated at this temperature for four hours and was, after the temperature had subsequently been increased to 285° C., further heat-treated for six hours. The laminate after the heat treatment was cooled down to 200° C. at the rate of 20° C./minute and was then removed from the hot air dryer. Measurement of the resultant laminate was carried to determine the discoloration, the bonding strength and the dimensional stability of the laminate. Also, with respect to the film obtained by removing the metal foil from the laminate by the use of the chemical etching technique, tests were conducted to determine the solder heat resistance temperature (the heat resistance), the strength and the frictional resistance thereof, results of which are tabulated in Table 6.

Example 2

The laminate and the film were obtained in a manner similar to Example 1, except that the laminate obtained as in (2) in Example 1 was fixed horizontally in the nitrogen atmosphere within a hot air dryer producing a hot gas of 260° C. in such a positional relationship that the film surface was oriented upwards while the copper foil surface was oriented downwards, to cause the film surface temperature to be increased to 260° C., and the heated laminate was heat-treated at this temperature for four hours and was, after the temperature had subsequently been increased to 300° C., further heat-treated for six hours. Similar tests to those in Example 1 were conducted on the resultant laminate and the film, results of which are tabulated in Table 6.

Example 3

The laminate and the film were obtained in a manner similar to Example 1, except that the laminate obtained as in (2) in Example 1 was fixed horizontally in the nitrogen atmosphere within a hot air dryer producing a hot gas of 260° C. to cause the film surface temperature to be increased to 260° C., and the heated laminate was heat-treated at this temperature for two hours and was, after the temperature had subsequently been increased to 290° C., further heat-treated for six hours. Similar tests to those in Example 1 were conducted on the resultant laminate and the film, results of which are tabulated in Table 6.

Example 4

In Example 1, the heat treatment atmosphere was an active atmosphere containing 1% of oxygen, and as the base material, an aluminum foil (rolled and with a maximum surface roughness of 1 $\mu$m) of 50 $\mu$m in thickness was used, and a silicone polymer (41G available from Chemlease Asia Ltd.) was applied to a rough surface side of the base material to a thickness of 0. 1 $\mu$m and was then dried. Other than those, the heat treatment was carried under the same condition as in Example 1 and the film was obtained by delaminating the base material. No discoloration was found in the surface of the base material, and the bonding strength while in the form of the laminate was 0.2 kg/cm and the film can easily delaminated by hand without being torn. Similar tests to those in Example 1 were conducted on the resultant laminate and the film, results of which are tabulated in Table 6.

Example 5

As the first heat treatment, the laminate obtained as in (2) in Example 1 was horizontally fixed in the nitrogen atmosphere within a hot air dryer producing a hot gas of 260° C. to cause the film surface temperature to be increased to 260° C., and the heated laminate was heat-treated at this temperature for two hours. The fusion peak temperature $TA_1$ of the film layer at this time was 296° C. Subsequently, as the second heat treatment, the temperature was increased to 285° C. and the heat treatment was conducted for three hours. $TA_2$ of the film layer at this time was 310° C. Again, as the third heat treatment, the temperature was increased to 295° C. and the heat treatment was conducted for three hours, resulting in $TA_3$ of 320° C. Furthermore, as the fourth heat treatment, the temperature was increased to 300° C. and the heat treatment was conducted for 2 hours, resulting in the $TA_4$ of 325° C. At this time, no discoloration was found in the surface of the base material and the bonding strength while in the form of the laminate was 1.2 kg/cm. Using the chemical etching technique in a manner as in Example 1, the metal foil was removed to obtain the film. Similar tests to those in Example 1 were conducted on the resultant laminate and the film, results of which are tabulated in Table 6.

Example 6

Except that in Example 4, the heat treatment atmosphere was an active atmosphere containing 1% of oxygen, and a silicone polymer (41G available from Chemlease Asia Ltd.) was applied to a rough surface, having a surface roughness of 1 $\mu$m, of a rolled aluminum foil of 50 $\mu$m in thickness, used as the base material, to a thickness of 0.4 $\mu$m and was then dried, the heat treatments were conducted under the same conditions as in Example 4, followed by delamination of the base material to produce the film. No discoloration was found in the surface of the base material, and the bonding strength while in the form of the laminate was 0.15 kg/cm and the film can easily be delaminated by hand without being torn. Similar tests to those in Example 1 were conducted on the resultant laminate and the film, results of which are tabulated in Table 6.

Comparison 1

Using the laminate obtained as in (2) in Example 1, the film was obtained with no heat treatment conducted and by removing the metal foil by the use of the chemical etching technique in a manner similar to that in Example 1. Similar tests to those in Example 1 were conducted on the resultant laminate and the film, results of which are tabulated in Table 6.

Comparison 2

Using the laminate obtained as in (2) in Example 1, the laminate was subjected to the heat treatment at 260° C. in the air for four hours and the subsequent heat treatment at 270° C., which was lower than the fusion temperature of 280° C. before the heat treatment, for four hours. By removing the metal foil with the use of the chemical etching technique in a manner similar to that in Example 1, the film was obtained. Similar tests to those in Example 1 were conducted on the resultant laminate and the film, results of which are tabulated in Table 6.

TABLE 6

|  | Laminate | | | Film left by removing Metal Foil from Laminate | | |
|---|---|---|---|---|---|---|
|  | Discoloration | Bonding Strength (Kg/cm) | Dimensional Stability (%) | Solder Resistance Temp. (° C.) | Strength (Kg/mm$^2$) | Frictional Resistance |
| Exm. 1 | ◯ | 1.2 | +0.10 | 360 | 65 | ◯ |
| Exm. 2 | ◯ | 1.3 | +0.05 | 350 | 63 | ◯ |
| Exm. 3 | ◯ | 1.2 | +0.10 | 350 | 65 | ◯ |
| Exm. 4 | ◯ | 0.2 | — | 360 | 65 | ◯ |

TABLE 6-continued

|  | Laminate | | | Film left by removing Metal Foil from Laminate | | |
|---|---|---|---|---|---|---|
|  | Discoloration | Bonding Strength (Kg/cm) | Dimensional Stability (%) | Solder Resistance Temp. (° C.) | Strength (Kg/mm$^2$) | Frictional Resistance |
| Exm. 5 | ○ | 1.2 | +0.10 | 370 | 68 | ○ |
| Exm. 6 | ○ | 0.15 | — | 370 | 68 | ○ |
| Com. 1 | ○ | 0.7 | +0.20 | 220 | 30 | Δ |
| Com. 2 | x | 0.7 | +0.20 | 240 | 38 | Δ |

Discoloration in the Table 6 above was determined in terms of a result of observation with naked eyes to determine the presence or absence of change in color of the base material of the laminate after the heat treatment, in which "○" represents no discoloration found and "x" represents a considerable discoloration found.

Bonding strength was that exhibited when, while the film layer of the laminate, 1.5 cm in width, was fixed on a flat plate, the base material was delaminated from the laminate at the rate of 50 mm/min. according to the 180° peel-off method.

Dimensional stability was measured according to the test method stipulated in C 6471 of the Japanese Industrial Standards.

Solder resistant temperature was measured according to the method stipulated in C 5016 of the Japanese Industrial Standards wherein the maximum temperature at which the film surface could retain the initial shape in a molten solder bath was observed. In other words, by placing the film in a solder bath of 260° C. for 5 to 60 seconds, morphological change such as deformation and/or bulging of the film surface was observed with naked eyes. Thereafter, change in appearance occurring in the film surface placed for 5 to 30 seconds in the solder bath having its temperature increased stepwise by an increment of 10° C. was observed with naked eyes and the maximum temperature at which neither bulging nor deformation was observed was measured.

Strength was measured in term of the tensile breakage strength according to the method stipulated in ASTM D 882.

Frictional resistance was evaluated in terms of the amount of film deposited on a frictional element when the frictional element, 10×15 mm in size, having a surface covered by a cloth and placed on the surface of the film was scanned continuously and reciprocatedly along the surface of the film a distance of 30 mm for one hour while loaded with a load of 500 gr. "x" represents that the amount of the film deposited is great; "○" represents no film deposited on the frictional element; and "Δ" represents the film amount intermediate therebetween.

As can be understood from Table 6 above, although in Comparison 1 discoloration of the copper foil could not be evaluated since no heat treatment was conducted, Comparison 2 has shown discoloration of the copper foil. Moreover, in each of those comparisons, since the solder resistant temperature is not higher than 350° C., bulging, peel-off and/or deformation would occur when, for example, at the time of mounting component parts on FPC board, the FPC board is dipped in the solder bath. Also, in each of those comparison, since the frictional resistance is low, frictional fatigue would readily occur at a bent portion when used as, for example, FPC board.

Contrary to the comparisons above, conducting the heat treatment a number of times as in each of Examples 1 to 6 results in the laminate in which the copper or aluminum foil does not discolor, which is excellent in heat resistance and frictional resistance and which is also excellent in bonding strength and dimensional stability. In particular, the heat resistant temperature of the film can be increased to a value not lower than 350° C. which is higher by 100° C. than that exhibited by that before the heat treatment (Comparison 1). For this reason, even when at the time of mounting of the component parts on the FPC board the FPC board is dipped in the solder bath, no deformation will occur and a favorable surface mounting can be accomplished.

Thus, according to the present invention, the film having an excellent heat resistance and, also, an excellent frictional resistance along with peculiarities of the liquid crystal polymer film such as a high strength, a high modulus of elasticity and a high resistance to chemicals, the laminate thereof and the multi-layered parts-mounted circuit board utilizing the laminate can be obtained at a reduced cost.

Although the present invention has been filly described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What is claimed is:

1. A method of making a liquid crystal polymer film in which a film comprising a polymer capable of forming an optically anisotropic melt phase (which polymer is hereinafter referred to as a liquid crystal polymer) is, after having been laminated on a base material capable of supporting a shape of the film during heat treatment, heat-treated a number of times in the following manner and the base material is subsequently removed to provide the liquid crystal polymer film:

First Heat Treatment:
This first heat treatment is carried out at a temperature range of from the thermal deformation temperature Tdef of the polymer film to a temperature lower by $\alpha$° C. than the melting point Tm of the polymer film before the heat treatment (i.e., Tdef~(Tm–$\alpha$° C.)), until the fusion peak temperature TA of the polymer film being heat-treated, which temperature TA is measured by the use of a differential scanning calorimeter under the atmosphere of nitrogen with temperature increased at a speed of 5° C. per minute, attains a temperature $TA_1$ which is higher by $\beta$° C. than the melting point Tm of the polymer film before the heat treatment, wherein $\alpha$ represents 10 to 35° C. and $\beta$ represents 5 to 30° C.

Second Heat Treatment:
This second heat treatment is carried out at a temperature range of from a temperature not lower than the melting point Tm of the polymer film before the heat-treatment to a temperature lower than the fusion peak temperature $TA_1$ until the fusion peak temperature $TA_1$ attains a temperature $TA_2$ that is increased $\gamma$° C. from the fusion peak temperature $TA_1$, wherein $\gamma$ represents 5 to 20° C.

n-th Heat Treatment:
This n-th heat treatment is carried out at a temperature range of from the fission peak temperature $TA_{n-2}$ to a temperature lower than the fission peak temperature $TA_{n-1}$ until the fusion peak temperature $TA_{n-1}$ attains a temperature $TA_n$ that is increased $\gamma°$ C. from the fuision peak temperature $TA_{n-1}$, wherein n represents an integer equal to or larger than 3 and $\gamma$ represents 5 to 20° C.

2. The method of making the liquid crystal polymer film as claimed in claim 1, wherein when the film is laminated with the base material;

the base material comprises a metal foil having a rough surface having surface irregularities, said rough surface having a maximum surface roughness Rmax, as defined by JIS B 0601, with the range of 1.0 to 10 μm;

a silicone polymer is coated to the rough surface of the metal foil to a thickness within the range of 0.1 to 1 μm;

the film is laminated with the metal foil with at least one surface of the film held in contact with the coated surface of the base material; and further, when the base material is to be removed after the heat treatment, a film layer obtained by cooling and solidifying the melted and softened film is delaminated from the base material.

3. A film manufactured by the method as defined in claim 1.

4. A film manufactured by the method as defined in claim 2.

5. A method of making a laminate comprising a film and a base material, which method comprises laminating a liquid crystal polymer film with the base material capable of supporting a shape of the film during heat treatment and conducting n times such heat treatment as defined in claim 1.

6. A laminate obtained by the method as defined in claim 5.

7. A multi-layered parts-mounted circuit board which comprises two or more laminates as defined in claim 6 and overlapped with each other with a sheet material optionally sandwiched between the laminates, and electronic component parts mounted thereon.

* * * * *